United States Patent [19]

Zaw Win et al.

[11] Patent Number: 5,021,680
[45] Date of Patent: Jun. 4, 1991

[54] VOLTAGE SUPPLY CIRCUIT FOR PROGRAMMING CIRCUITS OF PROGRAMMABLE LOGIC ARRAYS

[75] Inventors: Vincent K. Zaw Win, Milpitas; Andrew K. Chan, Palo Alto, both of Calif.

[73] Assignee: Advanced Micro Devices, Inc., Sunnyvale, Calif.

[21] Appl. No.: 387,012

[22] Filed: Jul. 31, 1989

[51] Int. Cl.$^5$ .......................... H03K 5/01; H03K 3/01
[52] U.S. Cl. ..................................... 307/243; 307/465; 307/296.1; 307/583
[58] Field of Search ..................... 307/296.1, 465, 571, 307/582, 583, 135, 243, 578; 365/226, 104

[56] References Cited

U.S. PATENT DOCUMENTS

| | | | |
|---|---|---|---|
| 4,694,430 | 9/1987 | Rosier | 365/226 |
| 4,697,101 | 9/1987 | Iwakashi et al. | 307/296.1 |
| 4,697,106 | 9/1987 | Watanabe | 365/226 |
| 4,733,105 | 3/1988 | Shin et al. | 307/243 |
| 4,835,423 | 5/1989 | de Ferron et al. | 307/296.1 |

Primary Examiner—Stanley D. Miller
Assistant Examiner—Richard Roseen
Attorney, Agent, or Firm—William J. Benman, Jr.

[57] ABSTRACT

A single, relatively simple, circuit which provides programming supply voltages for the programming circuits of a typical PAL type programmable logic array with minimal die size requirements. The invention includes a voltage charge pump circuit for providing a first voltage on a first output bus in response to a first supply voltage and an input pulse. The first output voltage provided on the first output bus is greater than the first supply voltage. The invention further includes a first circuit for switching the first supply voltage onto a second output bus in response to a first set of programming signals. A second circuit is included for switching a second supply voltage onto a second output bus in response to a second set of programming signals.

17 Claims, 2 Drawing Sheets

VOLTAGE SUPPLY CIRCUIT FOR PROGRAMMING CIRCUITS OF PROGRAMMABLE LOGIC ARRAYS

BACKGROUND OF THE INVENTION

1. Field of the Invention

The present invention relates to programmable logic arrays (PLAs). More specifically, the present invention relates to voltage pumps used in programmable array logic (PAL) circuits.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Programmable logic arrays provide 'glue logic' for PC (printed circuit) boards. Glue logic is the logic required to interface two boards and generally includes a plurality of AND gates, OR gates and input/output I/O buffers. PLAs consume less space and therefore generally provide glue logic in a less costly manner than individual AND gates, OR gates and I/O buffers.

PLAs also offer the advantage of reconfigurability over discrete or individual gates. That is, PLAs generally include an array of 'AND' gates, an array of 'OR' gates, and some provision for interconnecting the outputs of selected AND gates to the inputs of selected OR gates. PLAs allow a wide variety of logic functions to be implemented through the combination, via the OR gates, of the product terms, provided by the AND gates. Further, the configuration of the array may be quickly, easily and relatively inexpensively reprogrammed to implement other functions.

As described in U.S. Pat. No. 4,124,899, programmable array logic (PAL) circuits were developed to provide further improvements in the speed, space requirements, cost and power consumption of PLAs. PALs provide programmable AND and fixed OR functions. In a most general sense, a PAL provides a field programmable logic array in which a programmable array of circuit inputs are provided to a plurality of AND gates (cells) to generate product terms. Outputs from subgroups of AND gates are, in turn, nonprogrammably connected as inputs to individual, specified OR gates to provide the sum of products.

The programming circuit of the electrically erasable PAL type logic array typically includes an input term decoder circuit, a product term decoder circuit, a margin control circuit and a sense line control circuit. These decoders and control circuits require a number of voltage levels at different times during the programming of the EE array. A high voltage may be required for programming certain circuits while the other circuits may require low, zero, or other (floating state) voltages. Where high voltages are required, the voltages required may exceed the externally supplied voltage.

In conventional PAL devices, the programming circuits typically include individual high voltage charge pumps to provide the high voltages needed for the programming operation. Each charge pump typically includes a capacitive oscillator in the source circuit of a n-channel metal-oxide (NMOS) transistor. The capacitor is fed with a clock pulse which incrementally increases the voltage at the output of the device above the externally supplied voltage. Each voltage pump requires a connection to the external voltage source, a connection to the system clock, and connections for one or more programming control signals. As one such charge pump is typically provided for each of numerous programming circuits, it is clear that considerable die area is consumed by the multiplicity of charge pump circuits and lines associated therewith in conventional PAL devices.

Thus, there is a need in the art for a simple, effective high voltage pumping scheme for PAL type programmable logic arrays which requires few interconnections and minimum die area.

SUMMARY OF THE INVENTION

The need in the art is addressed by the present invention which provides a voltage supply circuit for programming circuits of electrically erasable programmable logic arrays. The voltage supply circuit of the present invention is a single, relatively simple, circuit which provides programming supply voltages for the programming circuits of a typical PAL type programmable logic array with minimal die size requirements.

In most general terms, the invention includes a voltage charge pump circuit for providing a first voltage on a first output bus in response to a first supply voltage and an input pulse. The first output voltage provided on the first output bus is greater than the first supply voltage. The invention further includes a first circuit for switching the first supply voltage onto a second output bus in response to a first set of programming signals. A second circuit is included for switching a second supply voltage onto a second output bus in response to a second set of programming signals.

DESCRIPTION OF THE INVENTION

Figure 1:
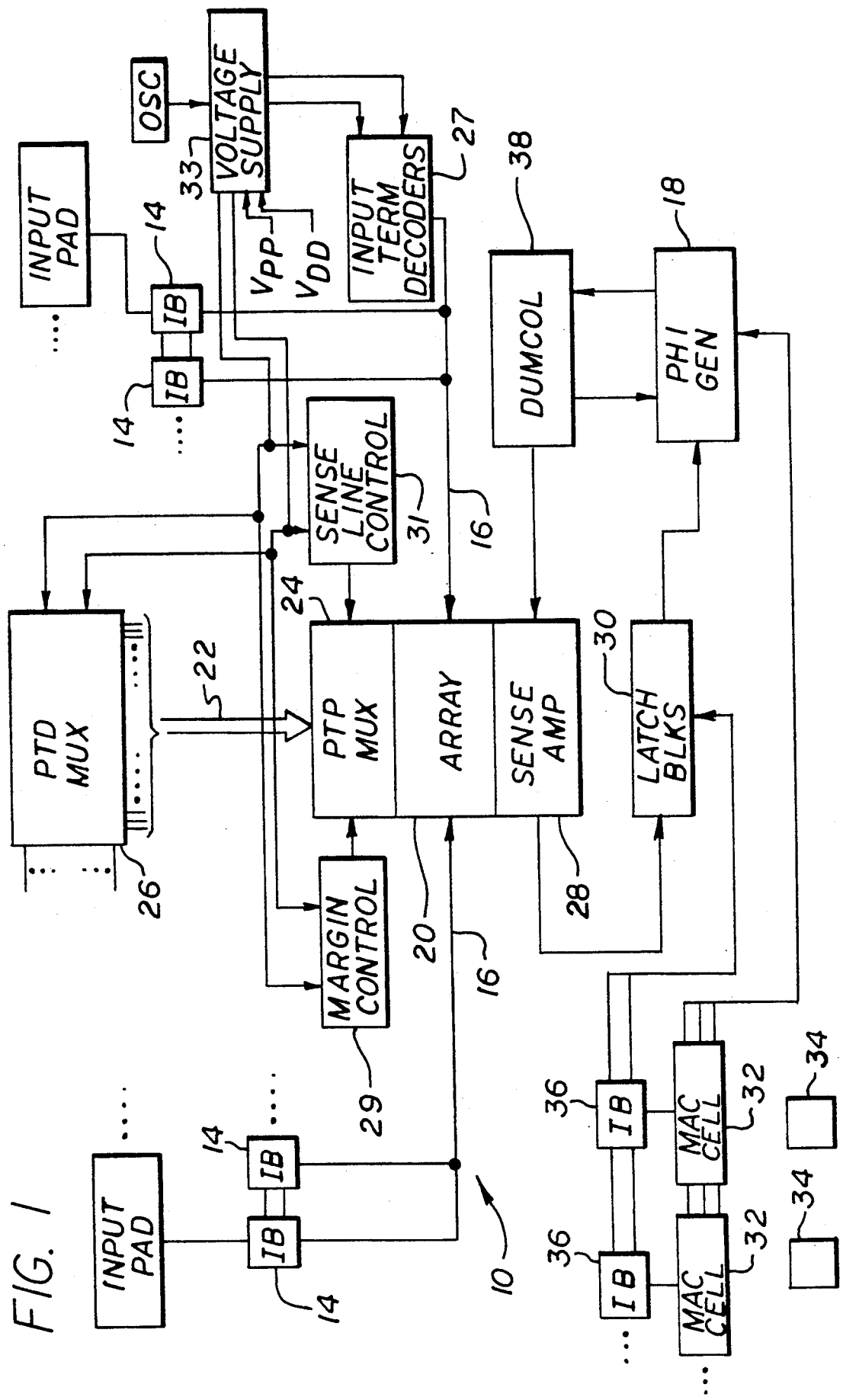
FIG. 1 is a simplified block diagram of an programmable array logic system incorporating the voltage supply circuit of the present invention.

FIG. 1 is a simplified block diagram of an illustrative programmable logic array, such as the PAL 10 system manufactured by Advanced Micro Devices Corporation of Sunnyvale, Calif., incorporating the voltage supply circuit of the present invention. As is generally known in the art, the PAL 10 is a programmable logic array of a particularly advantageous design which provides 'glue logic' for circuit interconnection at high speed with minimal power consumption. The PAL 10 includes a plurality of input pads 12 which are typically probe pads with electrostatic protection circuitry (not shown). Each input pad 12 is connected to an input buffer (IB) 14. Each input buffer 14 includes circuitry for detecting address transitions at a corresponding input pad 12. Each input buffer 14 is connected to a bus 16 and a phi generator 18 called transition detect signal (TDS) bus (not shown). The bus 16 communicates with an array 20 of electrically erasable ($E^2$) cells configured as AND gates.

As is known in the art, each input of each AND gate of the array 20 may be programmably interconnected to a selected line of an input data bus 16. The programming of the cells of the array 20 is controlled by a number of programming circuits including, by way of example, a product term decoder 26, an input term decoder 27, a margin control circuit 29 and a sense line control circuit 31. Each of the programming control circuits are connected to the array 20 as shown in FIG. 1. The product term decoder is connected to the array 20 through a PTP multiplexer 24. The design and operation of the programming circuits is known to those skilled in the art and not necessary for an understanding of the principles of the present invention.

It should be noted however that some or all of the programming control circuits require high voltages for programming and lower voltages for verification and normal operation. The programming voltage generally exceeds the voltages supplied externally to the PAL 10. The single voltage supply circuit 33 of the present invention provides voltages higher than external supply voltages for the programming circuits of the PAL 10 and other voltage levels for the programming circuits as discussed more fully below.

Figure 2:
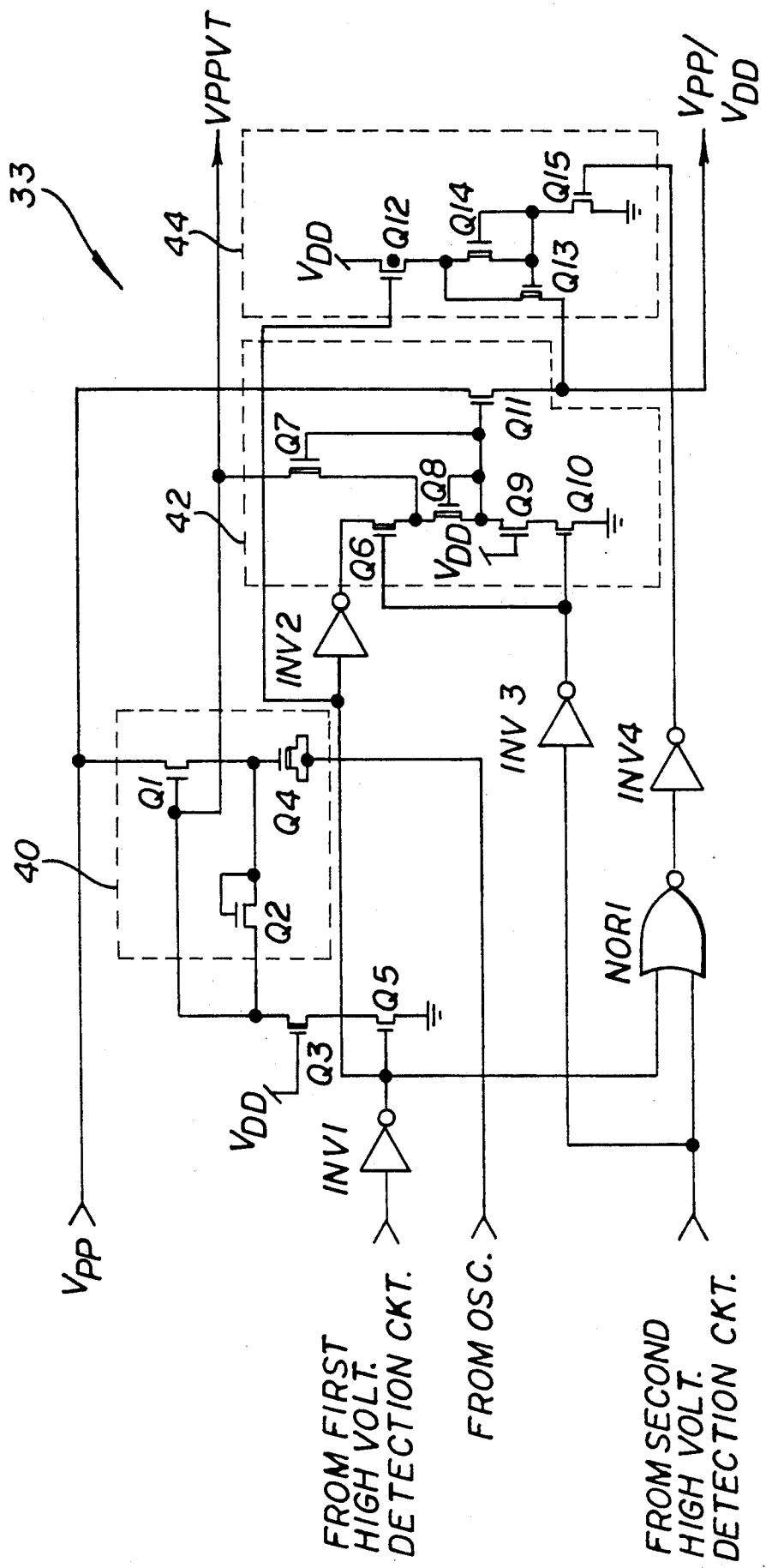
FIG. 2 is a schematic diagram of the voltage supply circuit of the present invention.

FIG. 2 is an illustrative embodiment of a schematic diagram of the voltage supply circuit 33 of the present invention. The voltage supply circuit 33 includes a voltage charge pump circuit 40 for providing a first voltage $V_{PP}+V_T$ on a first output bus VPPVT in response to a first supply voltage $V_{PP}$ and an input pulse. The first output voltage $V_{PP}+V_T$ provided on the first output bus VPPVT is greater than the first supply voltage $V_{PP}$. The voltage supply circuit 33 further includes a first circuit 42 for switching the first supply voltage $V_{PP}$ onto a second output bus VPP/VDD in response to a first set of programming signals. A second circuit 44 is included for switching a second supply voltage $V_{DD}$ onto a second output bus VPP/VDD in response to a second set of programming signals.

The charge pump circuit 40 includes a first n-channel metal-oxide semiconductor (NMOS) transistor Q1. The drain of the first n-channel MOS transistor Q1 is connected to the source of the first supply voltage $V_{PP}$ through line PIN1. This is typically a high voltage on the order of 12 or 14 volts. The source of Q1 is connected to a first depletion mode transistor Q4 configured as a capacitor. That is, the gate terminal provides the first terminal of the capacitor and the source and drain terminals are tied together to provide the second terminal of the capacitor. The second terminal of the capacitor provided by Q4 is connected to a source of an input clock pulse or oscillator ($V_T$) via line OSC. The gate of the first n-channel MOS transistor Q1 is connected to the first output bus VPPVT. A second n-channel MOS transistor Q2 is connected as a diode between the first terminal of the capacitor Q4 and the gate of the first n-channel MOS transistor Q1. The gate and drain of Q2 are tied together to provide an anode of the diode and the source provides the cathode thereof.

The drain of a second depletion mode transistor Q3 is connected to the gate of the first n-channel MOS transistor Q1. The gate of Q3 is connected to a source (not shown) of the second supply voltage $V_{DD}$. The source of Q3 is connected to the drain of a third n-channel MOS transistor Q5. The source of Q5 is connected to ground. The gate of Q5 is connected to the output terminal of a first inverter INV1. The input terminal of the inverter INV1 is connected to the a first high voltage detection circuit (not shown) through line PGM1 (hereinafter PIN1).

When a high supply voltage of $V_{PP}$ is placed on PIN1, the first high voltage detection circuit detects the presence of the high voltage $V_{PP}$ and sets line PGM1 (hereinafter PGM1) high. This turns off Q5, through the first inverter INV1, removes a ground from the base of Q1, and allows it to come on. When Q1 comes on, $V_{PP}$ is applied to the first terminal of the capacitor Q4. Now, whenever a pulse appears on line OSC, the voltage at the first terminal of the capacitor Q4 increases until Q1 reverse conducts. With an oscillator or clock (not shown) connected to the OSC input line, the voltage on the first terminal of the capacitor Q4 will continue to increase in a conventional manner.

The first and second switching circuits 42 and 44, respectively, control the voltage applied to the second output bus VPP/VDD. The first switching circuit 42 includes third, fourth, fifth and sixth depletion mode transistors Q6, Q7, Q8 and Q9, respectively, and fourth and fifth n-channel MOS transistors Q10 and Q11, respectively. The first switching circuit 42 is enabled whenever PGM1 is high through a second inverter INV2 connected between the output of the first inverter INV1 and the drain of the third depletion mode transistor Q6. The gate of the transistor Q6 is connected to a source of a second programming signal PGM2 via a third inverter INV3. The drain of the fourth depletion mode transistor Q7 is connected to the first output bus VPPVT. The source of Q7 is connected to the source of Q6. The fifth depletion mode transistor Q8 is connected as a diode with its drain connected to the source of Q6 and Q7. The gate and source terminals of Q8 are connected to the gate of the fifth n-channel MOS transistor Q11. The drain of Q11 is connected to the source of the first supply voltage $V_{PP}$ at PIN1. The source of Q11 is connected to the second output bus VPP/VDD. Thus, whenever Q11 is on, $V_{PP}$ is applied to the second output bus VPP/VDD. The fifth transistor Q11 comes on whenever the system 10 is in the programming mode, i.e., PGM1 is high and PGM2 is high. PGM1 is high, when $V_{PP}$ is present on PIN1. Thus, the first output bus VPPVT has a high voltage on it which is applied to the gate of Q11 through the pullup arrangement of Q7 and Q8. (Q7 and Q8 are sized so that the rise time of Q11 is not so fast that damage results to the thin oxide of the $E^2$ cells in array 20.) The fourth depletion mode transistor Q9 and the fourth n-channel MOS transistor Q10 provide a disabling circuit for Q11. The drain of Q9 is connected to the base of Q11, the gate of Q9 is connected to $V_{DD}$, and the source of Q9 is connected to the drain of Q10. The gate of Q10 is connected to the output of the third inverter INV3 and the source of Q10 is connected to ground. Thus, whenever PGM2 is high, Q10 is off and Q11 is free to turn on. Those skilled in the art will recognize that other voltage switching schemes may be used without departing from the scope of the present invention.

The second switching circuit 44 includes a p-channel MOS transistor Q12, fifth and sixth depletion mode transistors Q13 and Q14, respectively, and a sixth n-channel MOS transistor Q15. The drain of Q12 is connected to a source of the second supply voltage $V_{DD}$. The gate of Q12 is connected to the output of the first inverter INV1 and the drain of Q12 is connected to the drains of Q13 and Q14. The source of Q13 is connected to the second output bus VPP/VDD. The gate of Q13 is connected to the drain of Q15 along with the gate and source of Q14. Thus, Q14 is connected in a diode configuration with the anode thereof being connected to the drain of Q13 and the cathode connected to the drain of Q15. The source of Q15 is connected to ground. The gate of Q15 is connected to the output of a fourth inverter INV4. The fourth inverter INV4 is fed by a NOR gate NOR1. The inputs to the NOR gate are provided by the output of the first inverter INV1 and the second programming signal PGM2. Thus, whenever PGM1 is low (indicating a normal mode of operation) or PGM2 is high (indicating a programming mode of operation), Q15 is on and the second switching circuit is disabled. However, when $V_{PP}$ is present on PIN1 and a low voltage is present on a PIN13 (not shown) a second high voltage detection circuit (not shown) on PIN13 places PGM2 in a low state. This indicates a verify mode of operation by which Q15 is off. When Q15 is off, Q13 and Q14 are free to turn on. With PGM1 high Q12 is on and the second supply voltage $V_{DD}$ (e.g. 5 volts) is applied to the second output bus VPP/VDD through Q13.

In a normal mode of operation, the voltage on PIN1 is returned to 5 or 0 volts. The first high voltage detection circuit returns PGM1 to a low state. This turns on Q5 and disables the voltage pump circuit 40. This also turns off Q6 and Q12 and maintains a zero standby power mode. Also Q15 turns on through NOR1 and INV1. These states ensure that no programming voltages are present on either of the buses VPPVT or VPP/VDD in the normal mode of operation.

Table I below provides the dimensions (in microns) of the components of FIG. 2 of the illustrative embodiment.

TABLE I

| ELEMENT | WIDTH | LENGTH |
|---------|-------|--------|
| Q1 | 20 | 3 |
| Q2 | 20 | 3 |
| Q3 | 6 | 3 |
| Q4 | 120.473 | 13.849 |
| Q5 | 10 | 2.5 |
| Q6 | 15 | 3 |
| Q7 | 5 | 30 |
| Q8 | 5 | 30 |
| Q9 | 10 | 3 |
| Q10 | 15 | 2.5 |
| Q11 | 100 | 3 |
| Q12 | 20 | 3 |
| Q13 | 100 | 3 |
| Q14 | 6 | 3 |
| Q15 | 15 | 3 |
| INV1 | 6 | 6 |
| INV2 | 15 | 15 |
| INV3 | 6 | 6 |
| INV4 | 6 | 6 |
| NOR1 | 6 | 6 |

Thus, the present invention has been described herein with reference to a particular embodiment for a particular application. Those having ordinary skill in the art and access to the present teachings will recognize additional modifications applications and embodiments within the scope thereof. For example, the invention is not limited to implementation in either positive or negative logic. Nor is the invention limited to the use of field effect transistors. Any suitable switching element may be used in place of the transistors in the illustrative embodiments without departing from the scope of the present teachings.

It is therefore intended by the appended claims to cover any and all such applications, modifications and embodiments within the scope of the present invention.

Accordingly,

What is claimed is:

1. A voltage supply circuit for programming circuits of programmable logic arrays comprising:
   voltage charge pump means for providing a first voltage on a first output bus in response to a first supply voltage and an input pulse, said first output voltage being greater than said first supply voltage;
   first means for switching said first supply voltage onto a second output bus in response to a first set of programming signals; and
   second means for switching a second supply voltage onto said second output bus in response to a second set of programming signals.

2. The invention of claim 1 wherein said voltage charge pump means includes a MOS transistor having a drain terminal connected to a source of said first supply voltage, a source terminal connected to a first terminal of a capacitor and a gate terminal connected to said first output bus, a second terminal of said capacitor being connected to a source of said input pulse.

3. The invention of claim 2 wherein said capacitor is a depletion mode transistor, said first terminal of said capacitor being a gate terminal of said depletion mode transistor and the second terminal of said capacitor being a source and drain terminals of said depletion mode transistor.

4. The invention of claim 2 including a diode connected between the source and gate of said MOS transistor.

5. The invention of claim 4 wherein said diode is a MOS transistor having gate and drain terminals connected to said capacitor and a source terminal connected to the gate terminal of said MOS transistor.

6. The invention of claim 1 including disable means for disabling said voltage charge pump means in response to a disable signal.

7. The invention of claim 1 wherein said first switching means includes a first MOS transistor having a drain terminal connected to a source, of said first supply voltage, a source terminal connected to said second output bus and a gate terminal connected to said to said first output bus.

8. The invention of claim 7 including pullup means for applying the voltage on said first output bus to the gate of said first MOS transistor.

9. The invention of claim 8 wherein said pullup means includes a first depletion mode transistor having a drain terminal connected to said first output bus, a gate terminal connected to the gate terminal of said first MOS transistor and a source terminal connected to a drain terminal of a second depletion mode transistor, a gate and a source of said second depletion mode transistor being connected to said gate terminal of said first MOS transistor.

10. The invention of claim 9 including means for disabling said first MOS transistor.

11. The invention of claim 10 wherein said disabling means includes a third depletion mode transistor having a drain terminal connected to the gate of said first MOS transistor, a gate terminal connected to a source of a second supply voltage and a source terminal connected to a drain terminal of a second MOS transistor, a gate terminal of said second MOS transistor being connected to a source of said second set of programming signals, and a source terminal of said second MOS transistor being connected to ground.

12. The invention of claim 11 wherein said disabling means further includes an inverter connected between said source of said second set of programming signals and the gate terminal of said second MOS transistor.

13. The invention of claim 7 wherein said second switching means includes a first depletion mode transistor having a drain terminal connected to a source of a second supply voltage, a source terminal connected to the source terminal of said first MOS transistor, a gate terminal connected to a source and gate terminals of a second depletion mode transistor, a drain of said second depletion mode transistor being connected to the drain terminal of said first depletion mode transistor.

14. The invention of claim 13 including an MOS transistor having a drain terminal connected to said source of a second supply voltage, a source terminal connected the drain of said first depletion mode transistor and a gate terminal connected to a source of a disable signal.

15. The invention of claim 14 including means connected to said second switching means for disabling said second switching means.

16. The invention of claim 15 wherein said disabling means includes an MOS transistor having a drain terminal connected to the gate terminal of said first depletion mode transistor, a source terminal connected to ground, and a gate terminal connected to means for logically ORing said first and third programming signals.

17. A voltage supply circuit for programming circuits of programmable logic arrays comprising:

voltage charge pump means for providing a first voltage on a first output bus in response to a first supply voltage and an input pulse, said first output voltage being greater than said first supply voltage;

first means for switching said first supply voltage onto a second output bus in response to a first set of programming signals, said first switching means including a first MOS transistor having a drain terminal connected to a source of said first supply voltage, a source terminal connected to said second output bus and a gate terminal connected to said to said first output bus; and second means for switching a second supply voltage onto a second output bus in response to a second set of programming signals, said second switching means including a first depletion mode transistor having a drain terminal connected to a source of a second supply voltage, a source terminal connected to the source terminal of said first MOS transistor, a gate terminal connected to the source and gate terminals of a second depletion mode transistor, the drain of said second depletion mode transistor being connected to the drain terminal of said first depletion mode transistor.

* * * * *